United States Patent [19]

Saito

[11] Patent Number: 4,588,891
[45] Date of Patent: May 13, 1986

[54] SCANNING TYPE ELECTRON MICROSCOPE

[75] Inventor: Syobu Saito, Mito, Japan

[73] Assignee: Hitachi, Ltd., Tokyo, Japan

[21] Appl. No.: 595,733

[22] Filed: Apr. 2, 1984

[30] Foreign Application Priority Data

Apr. 4, 1983 [JP] Japan .................................. 58-57880

[51] Int. Cl.$^4$ ............................................. H01J 37/26
[52] U.S. Cl. .................................................... 250/310
[58] Field of Search .................. 250/310, 311, 396 R, 250/397, 398, 399, 492.2, 492.3

[56] References Cited

U.S. PATENT DOCUMENTS

| | | | |
|---|---|---|---|
| 3,351,755 | 11/1967 | Hasler | 250/310 |
| 3,783,281 | 1/1974 | Crewe | 250/311 |
| 4,288,692 | 9/1981 | Schamber et al. | 250/310 |

FOREIGN PATENT DOCUMENTS

| | | | |
|---|---|---|---|
| 46-16186 | 5/1971 | Japan | 250/311 |
| 52-21764 | 2/1977 | Japan | 250/310 |

OTHER PUBLICATIONS

Saito et al., Field Emission SEM Equipped with Noise Compensator, Proc. 31st Annual EMSA Meeting, New Orleans, LA., Aug. 1973.
Kyser et al., High Voltage Sweep and Controlled Magnetic Lens Current Supplies for the Electron Microprobe; Rev. Sci. Inst., vol. 43, No. 9, Sep. 1972.
Hantsche, Developement of an Improved Probe Current Stabilizing Unit for SEMs, Scanning, vol. 2, No. 1, 1979.
Cleaver, Stabilization of the Electron Probe Current in the SEM with a Field Emission Cathode, Int. J. Electronics, vol. 38, No. 4, 1975.

Primary Examiner—Bruce C. Anderson
Assistant Examiner—Paul A. Guss
Attorney, Agent, or Firm—Antonelli, Terry & Wands

[57] ABSTRACT

In a field emission scanning type electron microscope which varies widely a primary electron beam acceleration voltage, a width of the primary electron beam is thinly focused by a large acceleration voltage when the beam passes through the focusing lens. The AC variation caused due to the gases near an electron source is included in the primary electron beam current. The variation of the primary electron beam which spreads near an objective lens after it has passed through the focusing lens is detected by a detector near the objective lens. The secondary electron beam emitted from a specimen is detected by a scintillator to produce a scanning measurement signal. When the acceleration voltage is large, the scanning measurement signal is divided by an output signal of a detector near the objective lens. When the acceleration voltage is small, the measurement signal is divided by an output signal of a detector near the focusing lens. This selection may be performed by means for selecting on the basis of a ratio R (=(acceleration voltage $V_0$)/(lead-out voltage $V_1$) to be obtained from the high voltage source apparatus. Alternatively there may be provided comparator means for comparing the AC variations of the two signals which are obtained by dividing a scanning measurement signal by the signals of both detectors and selector means for applying the smaller signal to a display.

14 Claims, 11 Drawing Figures

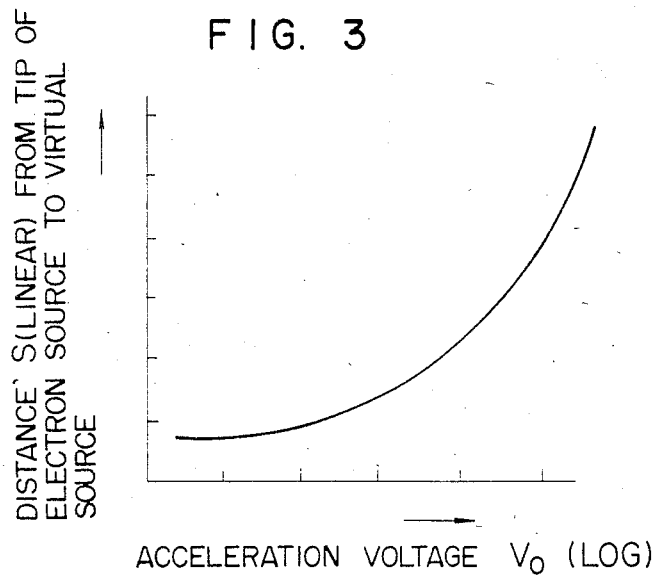
FIG. 3
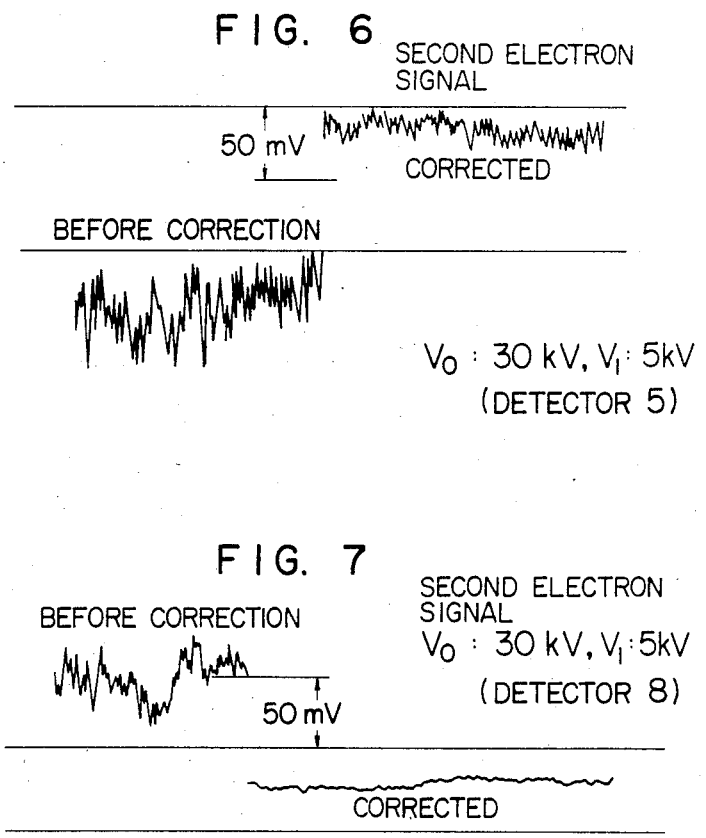
FIG. 6
FIG. 7

$V_O$ : 2 kV, $V_1$ : 5kV (DETECTOR 5)

$V_O$ : 2kV, $V_1$ : 5kV (DETECTOR 8)

SCANNING TYPE ELECTRON MICROSCOPE

The present invention relates to a scanning type electron microscope having a field emission (hereinbelow, abbreviated as FE) electron gun and, more particularly, to a circuit for correcting the current variation of an electron beam in an FE scanning electron microscope. The correction of a detection signal in the electron microscope is disclosed in U.S. Pat. No. 3,783,281 (Crewe).

Since the brightness presented by an FE electron gun is high and a size of an electron source is small, where the FE electron gun is used in a scanning type electron microscope (hereinafter, abbreviated as SEM), it has such features that it largely improves the performance and resolution power of the SEM and that it provides a longer service life as compared with a tungsten filament which is required to be heated. However, the tip of the electron source in the FE electron gun has a radius of 1000–2000 Å R and the current of the electron beam to be emitted therefrom is unstable in principle due to the presence of the gases near the cathode and the thermal fluctuation, so that it has a variation of about 5 to 20%. Due to this, an ordinary FE-SEM has a circuit for detecting the variation in this primary electron beam and correcting the variation component of the primary electron beam included in the secondary electron beam detection output signal from a specimen. This circuit provides a sufficient correcting effect in the cases where an acceleration voltage for the primary electron beam is a fixed value, e.g., 5 kV or 20 kV, or in a narrow variable range, e.g., 10–30 kV, and where a quantity of current of the primary electron beam is as small as, for example, 5 μA or less.

On the other hand, recently, in case of observing and analyzing various materials, the acceleration voltage requires a wide range of 0.1–50 kV (nearly 500 times between them), and a quantity of current of the electron beam also requires a control range from not larger than 5 μA to not smaller than 50 μA, i.e. a variable range of ten times or more in accordance with the lead-out voltage. Since a variation amount of current of the primary electron beam increases in proportion to an increase in FE current, the processing system with the higher degree of variation correction accuracy is needed. In addition, it is required that the sufficient variation correction effect is obtained in all of the above-mentioned change range of 500 times. However, as a result of research by the present inventor, it has been found that a conventional correction processing system cannot cope with such a requirement. Namely, the changes of the acceleration voltage and FE current cause the change in position of the virtual electron source on the assumption that the electron beam is emitted from one point in the electron gun. In the ordinary variation processing system, in case of remarkably changing the virtual position of the electron source, the sufficient correction effect is not obtained.

It is therefore an object of the present invention to provide a scanning type electron microscope whereby even when the position of a virtual electron source is remarkably changed, a sufficient correction effect of the electron beam current is obtained.

The present invention will be apparent from the following detailed description taken in conjunction with the accompanying drawings, in which:

FIG. 3 is a diagram showing the relation between the acceleration voltage $V_0$ and the distance S from the tip of an electron source to the virtual source;

FIGS. 6 and 7 are diagrams showing the measurement results;

An example of a conventional FE-SEM will be first described prior to the description of an embodiment of the present invention.

Figure 1:
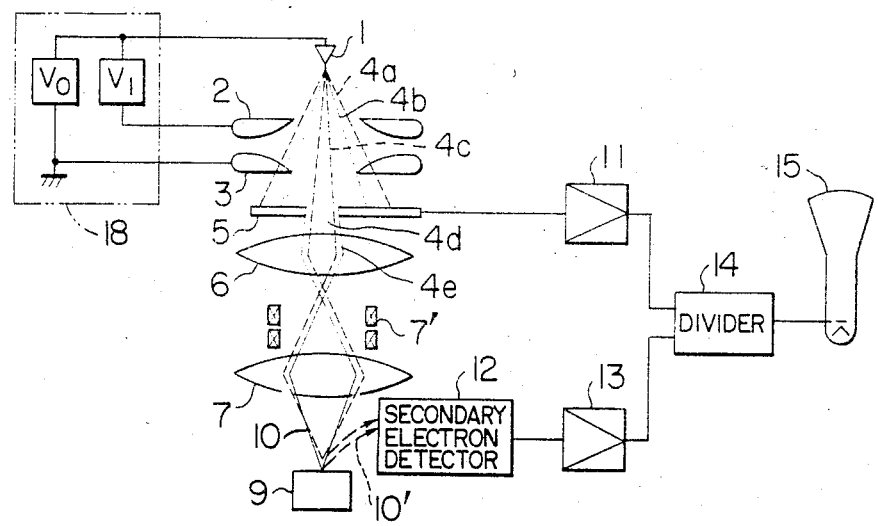
FIG. 1 shows a concept diagram of an ordinary FE-SEM.

FIG. 1 shows an example of a conventional FE-SEM. An FE-electron gun is constituted by a cathode 1, a first anode 2 and a second anode 3 and voltages are applied from a high voltage supply 18 to each electrode. An electron lead-out voltage $V_1$ is applied between the cathode 1 and the first anode 2, thereby allowing the electrons to be field-emitted from the cathode 1. These electrons emitted are accelerated by an acceleration voltage $V_0$ applied between the cathode 1 and the second anode 3 and become any one of primary electron beams $4_a$–$4_e$ depending upon a value of $V_0$. The accelerated electron beam is focused as a microprobe 10 on a specimen 9 by a first focusing lens 6 and a second focusing lens or objective lens 7. A signal of secondary electrons 10' generated at this time from the surface of this specimen 9 is detected by a detector 12 consisting of a well-known scintillator and a photomultiplier and is transmitted to a display or CRT 15 through an amplifier 13 and a correction circuit 14 which will be described later. On the other hand, a deflection signal synchronized with a deflection signal to be applied to a deflector of the display 15 is supplied to a deflector 7'. This permits the specimen 9 to be two-dimensionally scanned by the electron beam 10 which irradiates this specimen. Therefore, a picture image due to the secondary electrons of the specimen 9 is displayed on the display 15.

The primary electron beams $4_a$–$4_e$ generated on the basis of the field emission ordinarily have the current variations of about 5–20% depending upon the conditions of the degree of vacuum and temperature of the gases in the FE electron gun. To detect this variation, the detector 5 for catching a part of the electron beam 10 is provided near the focusing lens. This detector 5 has a hole at its center so as to detect only the portion near the periphery of the main electron beam serving as the final microprobe 10. The signal detected here is amplified by an amplifier 11 and is sent to the signal correction circuit 14, in which it is subjected to the division processing to correct (erase) the AC component corresponding to the variation in the primary electron beam included in the secondary electron beam 10' from the specimen. An output signal of the circuit 14 is sent as the corrected specimen to the display 15 and is displayed.

In the above-described ordinary apparatus, the sufficient variation correction cannot be performed in the case where the acceleration voltage $V_0$ can be varied in a wide range from a low acceleration voltage of about 0.1 kV to a high acceleration voltage of 40–50 kV, as will be needed in the research of various materials, excluding the case where the acceleration voltage $V_0$ can be varied in a narrow range of about 5–30 kV. This is because in the case where the variable range of the acceleration voltage $V_0$ is wide, as the acceleration voltage $V_0$ is changed from a low to high voltage, the emitted electrons are more thinly deflected such as indicated by reference numerals $4_a$ to $4_c$ due to the action of the electrostatic lens which is constituted by the first and second anodes 2 and 3 in the FE electron gun; wherein the electrostatic lens action is provided in accordance with the difference voltage of $(V_0-V_1)$. Thus, a quantity of primary electron beam which can be detected by the detector 5 will have been remarkably changed in accordance with the acceleration voltage conditions. For example, the emitted electrons $4_a$ under the lower acceleration voltage condition are cut by the second anode 3, so that a quantity of electrons which can be detected by the detector 5 is limited. On the other hand, the emitted electrons $4_c$ under the high acceleration voltage condition are too thinly focused, so that the electrons can hardly be detected by the detector 5; therefore, a desirable effect by way of the correction circuit 14 cannot be expected.

Figure 2:
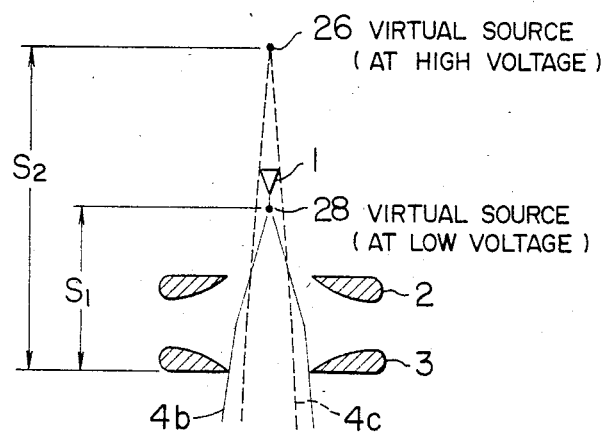
FIG. 2 is a diagram showing the deflecting state of the primary electron beam due to the action of electrostatic lenses of the first and second anodes and the position $S_1$ or $S_2$ of a virtual electron source.

FIG. 2 illustrates the deflecting state of the electron beam mentioned above in the enlarged diagram in the electron gun, in which $S_1$ or $S_2$ denotes a distance from the lower surface of the second anode 3 to the virtual electron source. Although it has been described in FIG. 1 that when the acceleration voltage is changed, a deflection angle of the electron beam varies due to the electrostatic lens action of the first and second anodes, this may be grasped as the change in position of the virtual electron source such as shown in FIG. 2 from another viewpoint, namely, when it is considered by defining the virtual electron source, i.e., a virtual point upon consideration of the actual electrostatic lens action. That is, the source position at the low acceleration voltage is $S_1$, i.e., the electron source locates almost near the cathode 1. While, it is $S_2$ under the high acceleration voltage condition as indicated by the broken line, i.e., the electron source locates far above the cathode. Strictly speaking, the position of the virtual electron source depends upon the ratio of the acceleration voltage $V_0$ to the lead-out voltage $V_1$, i.e., upon $R=V_0/V_1$. For instance, if the acceleration voltage is constant and the lead-out voltage becomes one half, the distance from the tip of the electron source to the virtual position S will be large, while the width of the primary electron beam will become thin. In general, the lead-out voltage $V_1$ is set at a value between 3 and 6 kV.

FIG. 3 shows a curve in which the lead-out voltage $V_1$ is constant and an axis of abscissa denotes the acceleration voltage $V_0$ and an axis of ordinate represents the distance S from the tip of the actual electron source to the virtual electron source. The virtual source goes back for the enforced voltage or an increased voltage $V_0$. As described above, in the case where it is necessary to remarkably change the acceleration voltage, there is needed current detecting means for performing the correction in consideration of the deflecting state of the primary electron beam due to the electrostatic lens action of the FE electron gun, i.e., in consideration of the difference in the virtual electron source position. This is also similar to the case where the acceleration voltage $V_0$ is constant and where the current of the primary electron beam is needed to be remarkably changed by varying the electron beam lead-out voltage $V_1$.

Several embodiments according to the present invention will be described hereinbelow.

Figure 4:
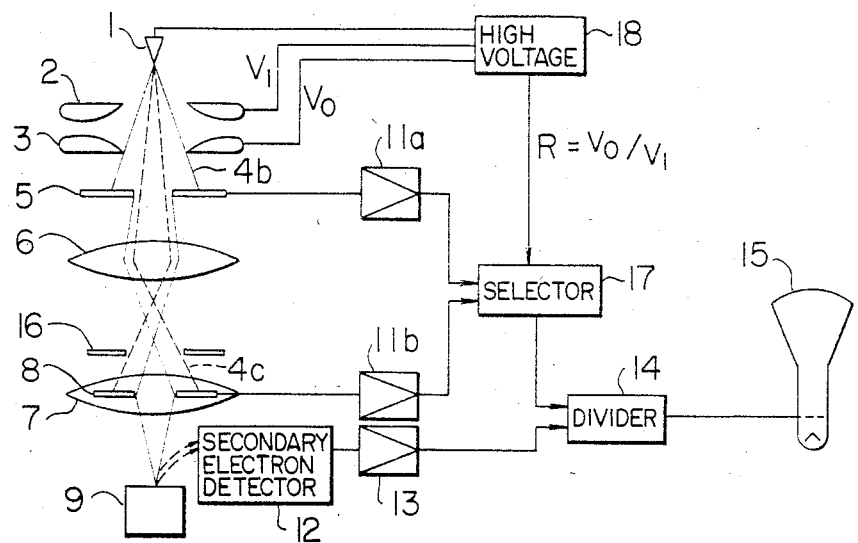
FIG. 4 is a concept diagram illustrating one embodiment of the present invention.

FIG. 4 illustrates one embodiment of the present invention. In this embodiment, in addition to the variation detector 5 of the primary electron beam, there is provided, in the second focusing lens 7, a detector 8 having at its center a circular hole of a diameter of 200–300 μm for allowing the primary electron beam to pass therethrough. A diaphragm 16 having a circular hole of a diameter of 4 mmφ is interposed between the first and second focusing lenses, this diaphragm serves to limit a detection angle of the primary electron beam of the second detector 8. Signals corresponding to two parts of the primary electron beam which were caught and detected by both detectors are respectively amplified by amplifiers $11_a$ and $11_b$ and are sent to a signal selector 17 as two reference signals for correction. The selector 17 receives the ratio R of the voltages $V_0$ and $V_1$ from the high voltage source 18 and when this ratio is larger than a certain critical value $R_0$, it selects the reference signal from the amplifier $11_b$, while otherwise, it selects the reference signal from the amplifier $11_a$ and sends the same to the division correction circuit 14. This correction circuit 14 comprises a wellknown log amplifier, subtraction circuit and anti-log amplifier (not shown) and divides the secondary electron signal from the amplifier 13 by the reference signal from the selector 17, then it sends the correction signal thus obtained to the CRT 15. Due to this division, the AC variation on the basis of the current variation of the primary electron beam included in the secondary electron signal is suppressed or removed, so that this allows the quality of the picture image to be scanned and displayed by the CRT 15 to be improved. The above-mentioned selection will be described using the electron beams $4_b$ and $4_c$ in FIG. 4.

Among the primary electron beams in FIG. 4, a reference numeral $4_b$ indicated by the solid line denotes the primary electron beam to be obtained under the low acceleration voltage condition; in this case, the first detector 5 is used. The electron beam $4_c$ indicated by the broken line is derived under the high acceleration voltage condition; in this case, it is detected by the second detector 8 since the detection by the first detector 5 is impossible. Therefore, it is necessary for the signal selector 17 to select either one of those detectors 5 and 8 in accordance with the acceleration voltage condition. In an actual apparatus, an alternative form for operation of the selector 17 may be such that the first detector 5 may be used below the acceleration voltage 5 kV, while the second detector 8 may be used over 10 kV. In addition, with respect to which detector is used in a range of 5–10 kV, the detector by which a better correction processing effect is obtained for the SEM which is used is selected among both detectors and is preset in the signal selector 17.

Figure 5:
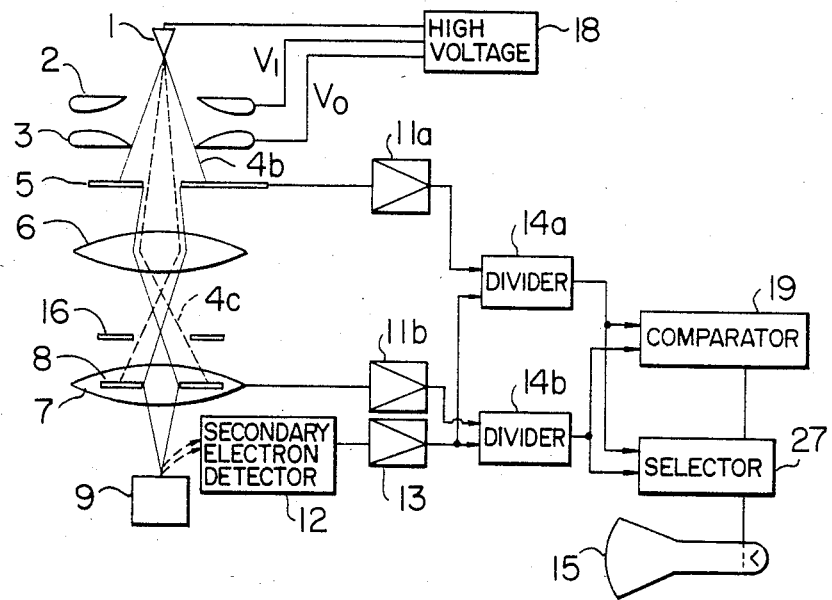
FIG. 5 is a concept diagram illustrating another embodiment of the present invention.

FIG. 5 shows another embodiment of the present invention. This embodiment shows a further automated apparatus of the constitution shown in FIG. 4. A comparator 19 receives correction output signals of two division correction circuits $14_a$ and $14_b$ and serves to automatically switch a signal selector 27 so as to select the correction output signal which includes less AC variation. In FIGS. 4 and 5, the detector to detect a part of the primary electron beam may be the detector disposed in the position subsequent to the diaphragm 16 or may be also the detector 5 which is commonly used as the diaphragm.

FIG. 6 shows the two signals: one is the signal of which the signal to be obtained from the secondary electron detector 12 under the acceleration voltage conditions of $V_0=30$ kV and $V_1=5$ kV was amplified by the amplifier 13; and the other is the signal of which the above-mentioned signal was corrected by the correction circuit $14_a$. Its variation width is about 25 mV.

FIG. 7 shows the two signals: one is the amplified signal of the amplifier 13 at the acceleration voltages of $V_0=30$ kV and $V_1=5$ kV; and the other is the signal of which the above amplified signal was corrected by the correction circuit $14_b$. Its variation width is about 5 mV.

Under such high acceleration voltage conditions, the latter correction signal is more flat, so that it will be appreciated that the detector 8 is to be selected in place of the detector 5.

As an ordinary image display signal, it has been confirmed by the experiments that if the correction processing has been performed so as to be not larger than 10 mV, the variation in primary electron beam is not displayed as the output signal. Therefore, it can be said that the data after the correction in FIG. 7 is the data representing that its correction effect is sufficiently obtained.

Figure 10:
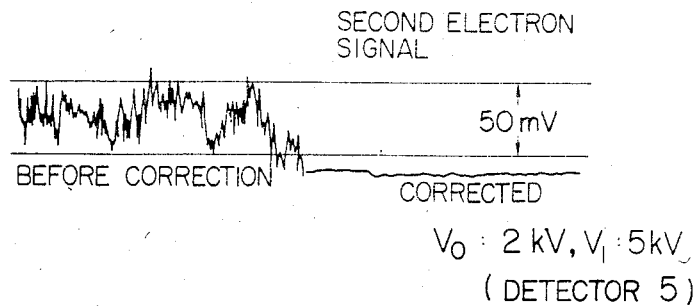
FIGS. 10 and 11 are diagrams showing the measurement results.
Figure 11:
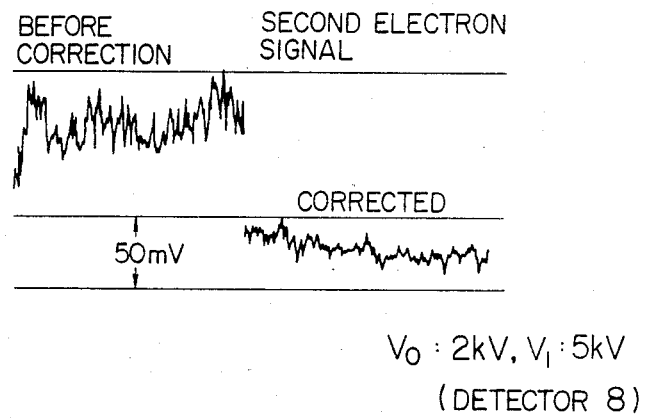

FIGS. 10 and 11 show the AC variation components of the signals to be obtained from the same circuits as in the cases shown in FIGS. 6 and 7 under the acceleration voltage conditions of $V_0=2$ kV and $V_1=5$ kV.

Under such low acceleration voltage conditions, it will be appreciated that the correction signal obtained by inputting the reference signal of which the signal from the detector 5 was amplified by the amplifier $11_a$ into the division correction circuit $14_a$ should be selected.

As will be obvious from the above description, according to the present invention, even in the cases where the acceleration voltage is largely changed and where the virtual electron source position is remarkably changed, the sufficient electron beam variation correction effect can be obtained.

The amplifiers $11_a$, $11_b$ and 13 actually include automatic amplification gain adjustment circuits.

The above-mentioned division processing can be realized using a microprocessor.

In addition, in FIGS. 4 and 5, although there is not shown the deflector 7' which is similar to that shown in FIG. 1 that is necessary to scan the specimen 9 by the primary electron beam, this is merely omitted.

Figure 8:
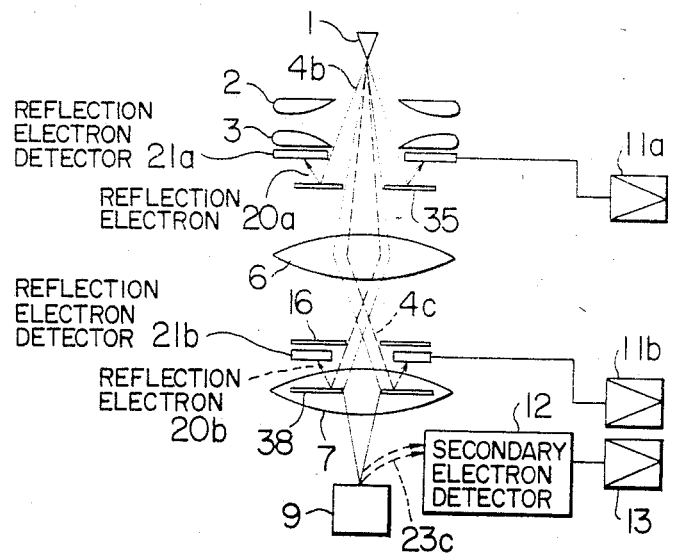
FIGS. 8 and 9 are diagrams illustrating other embodiments of the present invention.

FIG. 8 illustrates an embodiment in which there are respectively provided, near the first and second lenses, reflection electron detectors $21_a$ and $21_b$ for detecting reflection electrons $20_a$ and $20_b$ produced as the result of that the primary electron beams $4_b$ and $4_c$ collided with reflecting plates 35 and 38. The connections of the outputs of the respective amplifiers $11_a$, $11_b$ and 13 are omitted. In this embodiment, it is possible to realize the correction using the detection signals of the reflection electron beams as the reference signals.

Figure 9:
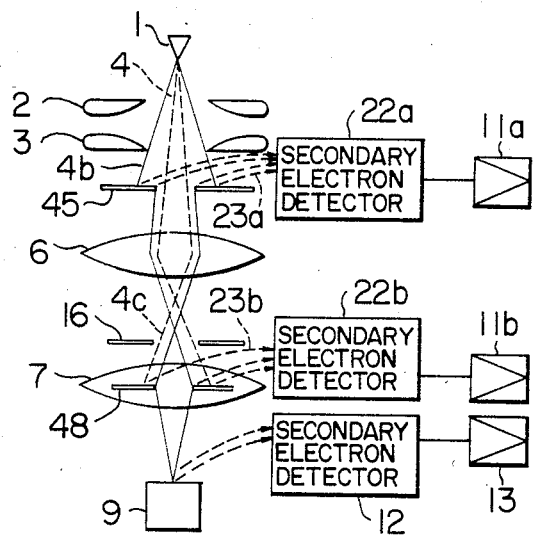

FIG. 9 shows another embodiment in which there are respectively provided, near the first and second lenses, secondary electron detectors $22_a$ and $22_b$ for detecting secondary electrons $23_a$ and $23_b$ produced as the result of that the primary electron beams $4_b$ and $4_c$ collided with secondary electron emitting plates 45 and 48. In the apparatus according to this embodiment, it is possible to perform the correction using, as the reference signals, the secondary electron beam detection signals having the variations corresponding to the variations in currents which the primary electron beams have.

Any of the foregoing embodiments shows the apparatuses which correct the measurement secondary electron signals in the FE-SEM. However, it is apparent that the present invention can be also applied to the measuring apparatus which is provided with detectors for detecting the X-ray detection signal, cathode luminescence, transmission electrons, absorption electrons into a specimen, and Auger electrons which are produced by scanning on the specimen by the primary electron beam spot similarly in the FE-SEM, thereby to correct output signals of these detectors.

Although the electric field to be caused near the electron source tip due to the lead-out voltage $V_1$ is approximately $E=1$ V/Å $=10^7$ V/mm, even in the case where the electron source was heated to increase a quantity of current of the primary electron beam to be led out, the correction can be performed by providing the detectors according to the present invention.

Any of the embodiments described above does not limit the present invention, but many modifications and variations of the present invention are within the scope of the invention.

I claim:

1. A scanning type electron microscope comprising:
   (a) means for electric-field-emitting an electron beam;
   (b) means for focusing the electron beam on a specimen;
   (c) means for scanning the specimen with the focussed electron beam to thereby obtain an electric signal inherent in the specimen;
   (d) first electron detector means disposed at a first position between the electron beam electric-field-emitting means and the specimen;
   (e) second electron detector means disposed at a second position different from the first position in a direction along the axis of the electron beam between the electron beam electric-field-emitting means and the specimen;
   (f) means for selecting one of the first and second electron detector means so that the selected electron detector means detects a part of the electron beam and converts the detected part into a compensation electric signal; and
   (g) means for generating a compensated electric signal corresponding to a radio of the electric signal inherent in the specimen and the compensation electric signal.

2. A scanning type electron microscope according to claim 1, wherein said second electron detector means is disposed nearer the specimen than said first electron detector means and said selecting means selects one of the first and second electron detector means in response to the magnitude of the electric field applied to said electron beam.

3. A scanning type electron microscope according to claim 2, wherein each of said first and second electron detector means has an aperture for passing therethrough a portion of said electron beam and outputting a signal corresponding to a truncated portion of said electron beam, and said compensated electric signal generating means includes a divider for obtaining said compensation electric signal.

4. A scanning type electron microscope comprising:

(a) an electron gun having a field emission electron source at a tip thereof;

(b) a focusing lens for focusing a primary electron beam to be emitted from said electron source due to an electric field;

(c) an objective lens for irradiating the primary electron beam which passed through said focusing lens onto a specimen:

(d) first detector means provided nearer said electron gun than said focusing lens for detecting a periphery of said primary electron beam generated from a virtual source located proximate to the tip of the electron gun with a first electric field being applied to the primary electron beam;

(e) a second detector means provided near said objective lens for detecting a periphery of said primary electron beam which is generated from a virtual source located behind the tip of the elecron gun when an increased electric field with respect to the first electric field is applied to said primary electron beam, (f) third detector means provided near said specimen for detecting a measurement signal to be generated from said specimen as a result of said primary electron beam being irradiated on the specimen;

(g) selector means for receiving the outputs of said first and second detector means and for selecting one of outputs of said first and second detector means; and (h) a divider for outputting a correction signal obtained by dividing an output signal of said third detector means by an output signal of said selector means, wherein in accordance with an acceleration voltage $V_0$ applied between said electron source and an anode, said selector selects the output of said first detector means when said voltage $V_0$ is smaller than a predetermined value and selects the output of said second detector means when said volage $V_0$ is equal to or larger than said predetermined value.

5. A scanning type electron microscope according to claim 4, wherein said first detector means is provided with an aperture at the center thereof for allowing a part of said primary electron beam to pass therethrough, and said second detector means is provided with an aperture at the center thereof for allowing a part of said primary electron beam to pass therethrough.

6. A scanning type electron microscope according to claim 5, further comprising a diaphragm, provided between said second detector means and said focusing lens, for blocking a peripheral portion of a beam width of said primary electron beam from reaching said second detector means.

7. A scanning type electron microscope according to claim 4, wherein said measurement signal is provided based on the detection of a secondary electron beam generated from the specimen onto which the primary electron beam is scanned and irradiated.

8. A scanning type electron microscope according to claim 4, wherein said measurement signal is provided based on a cathode luminescence signal generated from the specimen onto which said primary electron beam is scanned and irradiated.

9. A scanning type electron microscope comprising:
(a) an electron gun having a field emission electron source at a tip thereof;

(b) a focusing lens for focusing a primary electron beam to be emitted from said electron source due to an electric field;

(c) an objective lens for irradiating the primary electron beam which passed through said focusing lens onto a specimen;

(d) a first detector means prvoided nearer said electron gun than said focusing lens for detecting a periphery of said primary electron beam generated from a virtual source located proximate to the tip of the electron gun with a first electric field being applied to the primary electron beam;

(e) a second detector means provided near said objective lens for detecting a periphery of said primary electron beam which is generated from a virtual source located behind the tip of the electron gun when an increased electric field with respect to the first electric field is applied to said primary electron beam;

(f) third detector means provided near said specimen for detecting a meaurement signal to be generated from said specimen as a result of said primary electron beam being irradiated on the specimen;

(g) a first divider for outputting a first correction signal obtained by dividing the output signal of said third detector means by the output signal of said first detector means;

(h) a second divider for outputting a second correction signal obtained by dividing the output signal of said third detector means by the output signal of said second detector means;

(i) a comparator for comparing the magnitude of AC components included in said first and second correction signals; and (j) selector means for selecting and outputting the correction signal which includes the smaller AC component between said first and second correction signals in accordance with the output of said comparator.

10. A scanning type electron microscope according to claim 9, wherein said first detector means is provided with an aperture at the center thereof for allowing a part of said primary electron beam to pass therethrough, and said second detector means is provided with an aperture at the center thereof for allowing a part of said primary electron beam to pass therethrough.

11. A scanning type electron microscope according to claim 10, further comprising a diaphragm, provided between said second detector means and said focusing lens, for blocking a peripheral portion of abeam width of said primary electron beam from reaching said second detector means.

12. A scanning type electron microscope according to claim 9, wherein said measurement signal is provided based on the detection of a secondary electron beam generated from the specimen onto which the primary electron beam is scanned and irradiated.

13. A scanning type electron microscope according to claim 9, wherein said measurement signal is provided based on a cathode luminescence signal generated from the specimen onto which said primary electron beam is scanned and irradiated.

14. A scanning type electron microscope according to claim 11, wherein said diaphragm has an inner diameter corresponding to a value of a detection angle for said primary electron beam.

* * * * *